United States Patent
Date

(10) Patent No.: US 12,051,483 B2
(45) Date of Patent: Jul. 30, 2024

(54) SEMICONDUCTOR MEMORY DEVICE INCLUDING MEMORY STRING AND PLURALITY OF SELECT TRANSISTORS AND METHOD INCLUDING A WRITE OPERATION

(71) Applicant: Kioxia Corporation, Tokyo (JP)

(72) Inventor: Hiroki Date, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 267 days.

(21) Appl. No.: 17/729,114

(22) Filed: Apr. 26, 2022

(65) Prior Publication Data

US 2022/0254393 A1    Aug. 11, 2022

Related U.S. Application Data

(63) Continuation of application No. 16/862,893, filed on Apr. 30, 2020, now Pat. No. 11,335,388, which is a
(Continued)

(30) Foreign Application Priority Data

Sep. 6, 2018    (JP) .................................. 2018-166583

(51) Int. Cl.
*G11C 7/22*        (2006.01)
*G11C 16/08*       (2006.01)
(Continued)

(52) U.S. Cl.
CPC ................ *G11C 7/22* (2013.01); *G11C 16/08* (2013.01); *G11C 16/10* (2013.01); *G11C 16/28* (2013.01);
(Continued)

(58) Field of Classification Search
CPC ........... G11C 7/22; G11C 16/08; G11C 16/10; G11C 16/28; G11C 16/32; H10B 41/27
(Continued)

(56) References Cited

U.S. PATENT DOCUMENTS 9,343,121 B2    5/2016  Jang et al.
9,672,929 B2    6/2017  Maejima
(Continued)

FOREIGN PATENT DOCUMENTS

JP    2016171243 A    9/2016
JP    2017054562 A    3/2017
(Continued)

OTHER PUBLICATIONS

Notice of Allowance dated Jan. 20, 2022, issued in parent U.S. Appl. No. 16/862,893.
(Continued)

*Primary Examiner* — Connie C Yoha
(74) *Attorney, Agent, or Firm* — Holtz, Holtz & Volek PC

(57) ABSTRACT

In a semiconductor memory device, in a write operation performed to a memory cell transistor, a first voltage is applied to a first word line and a second voltage lower than the first voltage is applied to a second word line. When a stop command is received during the write operation, a third voltage lower than the second voltage is applied to the first and second word lines, thereafter a fourth voltage higher than the third voltage is applied to a first selection line, thereon or thereafter a fifth voltage higher than the fourth voltage is applied to the first and second word lines, thereafter a sixth voltage lower than the fourth voltage is applied to the first selection line, and thereafter a seventh voltage is applied to the first and second word lines.

21 Claims, 10 Drawing Sheets

Related U.S. Application Data continuation of application No. 16/259,259, filed on Jan. 28, 2019, now Pat. No. 10,685,689.

(51) Int. Cl.
*G11C 16/10* (2006.01)
*G11C 16/28* (2006.01)
*G11C 16/32* (2006.01)
*H10B 43/27* (2023.01)
*H10B 43/35* (2023.01)
*H10B 43/40* (2023.01)
*H10B 41/27* (2023.01)
*H10B 41/35* (2023.01)
*H10B 41/40* (2023.01)

(52) U.S. Cl.
CPC ............ *G11C 16/32* (2013.01); *H10B 43/27* (2023.02); *H10B 43/35* (2023.02); *H10B 43/40* (2023.02); *H10B 41/27* (2023.02); *H10B 41/35* (2023.02); *H10B 41/40* (2023.02)

(58) Field of Classification Search
USPC ...................................................... 365/230.05
See application file for complete search history.

(56) References Cited

U.S. PATENT DOCUMENTS

| | | | |
|---|---|---|---|
| 9,792,996 B1 | 10/2017 | Date | |
| 9,865,351 B2 | 1/2018 | Maejima | |
| 10,037,813 B2 | 7/2018 | Maejima et al. | |
| 10,090,056 B2 | 10/2018 | Hioka | |
| 10,210,938 B2* | 2/2019 | Harada | G11C 16/10 |
| 10,418,118 B2 | 9/2019 | Date | |
| 10,622,079 B2 | 4/2020 | Date | |
| 10,685,689 B2 | 6/2020 | Date | |
| 11,049,573 B2* | 6/2021 | Funatsuki | H10B 41/27 |
| 2011/0199825 A1 | 8/2011 | Han et al. | |
| 2014/0269095 A1 | 9/2014 | Maejima | |
| 2016/0148703 A1 | 5/2016 | Kim et al. | |
| 2016/0268304 A1 | 9/2016 | Ikeda et al. | |
| 2017/0154680 A1 | 6/2017 | Lee | |
| 2018/0006051 A1 | 1/2018 | Nagashima et al. | |
| 2018/0190354 A1 | 7/2018 | Lee | |
| 2018/0261267 A1 | 9/2018 | Shimura et al. | |
| 2018/0277228 A1 | 9/2018 | Takada et al. | |
| 2019/0088312 A1 | 3/2019 | Shiino | |
| 2021/0082505 A1 | 3/2021 | Suzuki | |

FOREIGN PATENT DOCUMENTS

| | | |
|---|---|---|
| JP | 2017054571 A | 3/2017 |
| JP | 2017142874 A | 8/2017 |
| JP | 2018147539 A | 9/2018 |
| TW | 201142990 A | 12/2011 |
| TW | 201701454 A | 1/2017 |

OTHER PUBLICATIONS

Office Action (Non-Final Rejection) dated Sep. 16, 2021, issued in parent U.S. Appl. No. 16/862,893.

* cited by examiner

SEMICONDUCTOR MEMORY DEVICE INCLUDING MEMORY STRING AND PLURALITY OF SELECT TRANSISTORS AND METHOD INCLUDING A WRITE OPERATION

CROSS-REFERENCE TO RELATED APPLICATIONS

This application is a Continuation application of U.S. application Ser. No. 16/862,893, filed Apr. 30, 2020, which is a Continuation application of U.S. application Ser. No. 16/259,259, filed on Jan. 28, 2019, and issued as U.S. Pat. No. 10,685,689 on Jun. 16, 2020, which is based upon and claims the benefit of Japanese Patent Application No. 2018-166583, filed on Sep. 6, 2018, the entire contents all of which are incorporated herein by reference.

BACKGROUND

Field

Embodiments according to the present invention relate to a semiconductor memory device.

Description of the Related Art

A semiconductor memory device including a substrate, a plurality of wirings and a semiconductor film facing the plurality of wirings is well known.

DETAILED DESCRIPTION

Figure 1:
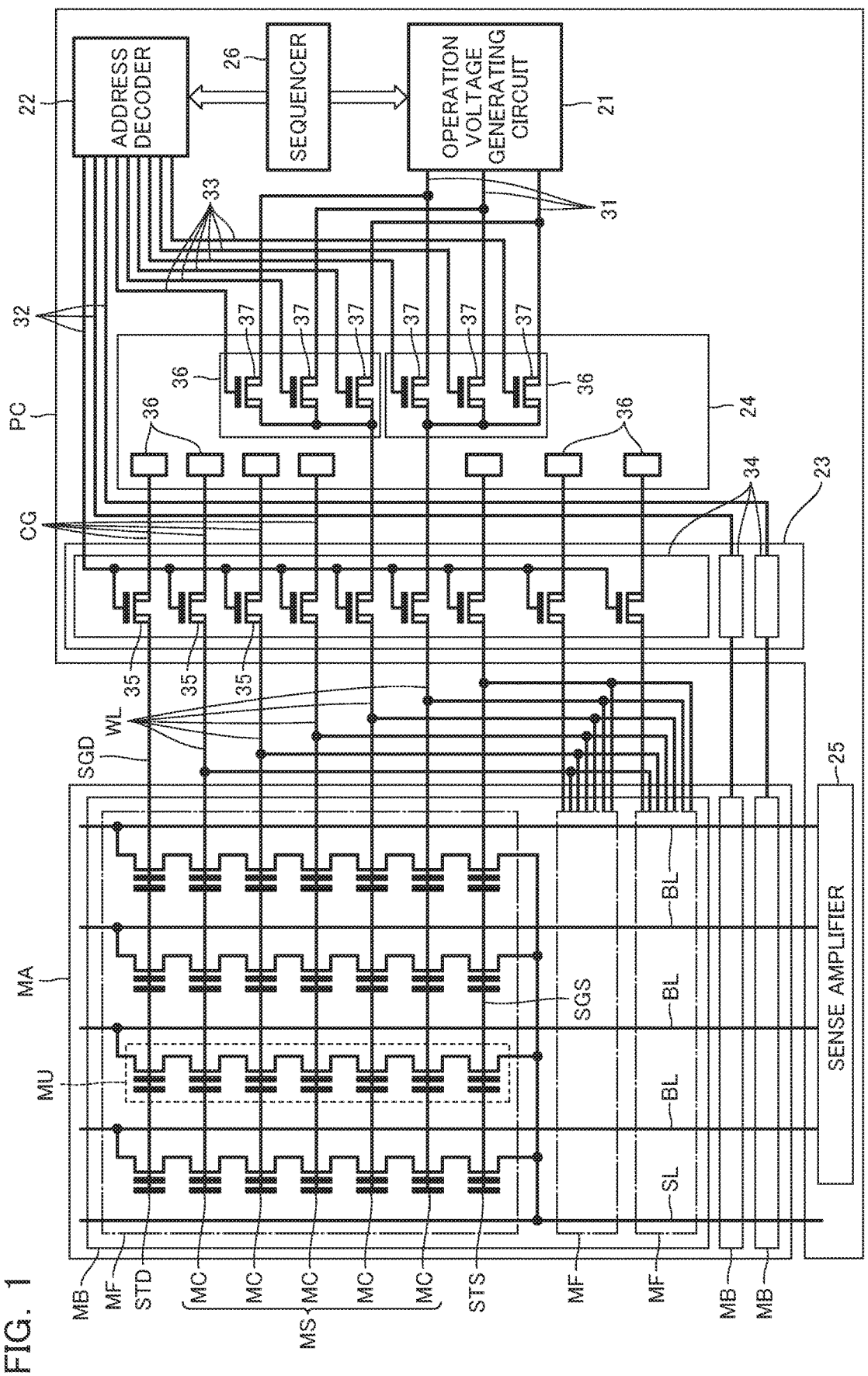
FIG. 1 shows an equivalent circuit diagram showing a schematic configuration of a semiconductor memory device according to a first embodiment.

A semiconductor memory device according to one embodiment includes: a substrate; a first memory transistor and a first selection transistor aligned in a first direction intersecting a surface of the substrate and connected to each other; a first wiring connected to a gate electrode of the first memory transistor; and a second wiring connected to a gate electrode of the first selection transistor. Moreover, in a write operation performed to the first memory transistor, at a first timing, a voltage of the first wiring rises, at a second timing after the first timing, the voltage of the first wiring falls, at a third timing after the second timing, a voltage of the second wiring rises, at the third timing or at a fourth timing after the third timing, the voltage of the first wiring rises, at a fifth timing after the voltage of the first wiring rises at the third timing or the fourth timing, the voltage of the second wiring falls, and at a sixth timing after the fifth timing, the voltage of the first wiring falls.

A semiconductor memory device according to one embodiment includes: a substrate; a first memory transistor and a first selection transistor aligned in a first direction intersecting a surface of the substrate and connected to each other; a first wiring connected to a gate electrode of the first memory transistor; and a second wiring connected to a gate electrode of the first selection transistor. Moreover, in a write operation performed to the first memory transistor, at a first timing, a voltage of the first wiring rises, at a second timing after the first timing, a voltage of the second wiring rises, at a third timing after the second timing, the voltage of the second wiring further rises, at a fourth timing after the third timing, the voltage of the second wiring falls, and at a fifth timing after the fourth timing, the voltage of the first wiring falls.

A semiconductor memory device according to one embodiment includes: a substrate; a first memory transistor and a first selection transistor aligned in a first direction intersecting a surface of the substrate and connected to each other; a first wiring connected to a gate electrode of the first memory transistor; a second wiring connected to a gate electrode of the first selection transistor; and a third wiring connected a drain electrode of the first selection transistor. Moreover, in a write operation performed to the first memory transistor, at a first timing, a voltage of the first wiring rises, at a second timing after the first timing, a voltage of the third wiring rises, at a third timing after the second timing, a voltage of the second wiring rises, at a fourth timing after the third timing, the voltage of the third wiring falls, at a fifth timing after the fourth timing, the voltage of the second wiring falls, and at a sixth timing after the fifth timing, the voltage of the first wiring falls.

Next, semiconductor memory devices according to embodiments will be described in detail with reference to the drawings. Note that the embodiments below are merely examples, and, are not shown with the intention of limiting the present invention.

Moreover, in the present specification, a certain direction parallel to a surface of the substrate will be called as an X direction, a direction parallel to the surface of the substrate and perpendicular to the X direction will be called as a Y direction, and, a direction perpendicular to the surface of the substrate will be called as a Z direction.

Moreover, in the present specification, a direction along a certain plane will be called as a first direction, a direction intersecting the first direction along the certain plane will be called as a second direction, and a direction intersecting the certain plane will be called as a third direction. These first direction, second direction and third direction may or may not correspond to any of the X direction, Y direction and Z direction.

In addition, in the present specification, expressions such as "up" and "down" are based on the substrate. For example, when the first direction intersects a surface of the substrate, an orientation of moving away from the substrate along the first direction will be called as up, and an orientation of coming closer to the substrate along the first direction will be called as down. Moreover, when a lower surface or a lower end is referred to for a certain configuration, this is assumed to mean a surface or end closer to the substrate of this configuration, and, when an upper surface or an upper end is referred to for a certain configuration, this is assumed to mean a surface or end opposite from the substrate of this configuration. In addition, a surface intersecting at least one of the second direction and the third direction will be called as a side surface, etc.

Also, in the present specification, when a first configuration "is electrically connected" to a second configuration, the first configuration may be directly connected to the second configuration, or the first configuration may be connected to the second configuration via a wiring, a semiconductor member and a transistor etc. For example, when three transistors are connected in series, even if the second transistor is in an OFF state, the first transistor is "electrically connected" to the third transistor.

Also, in the present specification, when a first configuration "is electrically insulated" from a second configuration, this means a state, for example, that an insulation film etc. is provided between the first configuration and the second configuration, and no contact and wiring etc. for connecting the first configuration and the second configuration is provided.

First Embodiment

[Configuration]

Hereinafter, a configuration of a semiconductor memory device according to a first embodiment will be explained with reference to the drawings. Note that the following drawings are schematic and a part thereof will be sometimes omitted for convenience of explanation.

FIG. 1 is an equivalent circuit diagram showing a schematic configuration of a semiconductor memory device according to the first embodiment.

The semiconductor memory device according to this embodiment includes: a memory cell array MA; and a peripheral circuit PC that controls the memory cell array MA.

The memory cell array MA includes a plurality of memory blocks MB. The plurality of memory blocks MB each include a plurality of memory fingers MF. The plurality of memory fingers MF each includes a plurality of memory units MU. One ends of the plurality of memory units MU are each connected to the peripheral circuit PC via a bit line BL. Moreover, the other ends of the plurality of memory units MU are each connected to the peripheral circuit PC via a common source line SL.

The memory unit MU includes a drain selection transistor STD, a memory string MS, and a source selection transistor STS connected in series between the bit line BL and the source line SL. Hereinafter, the drain selection transistor STD and the source selection transistor STS will be sometimes simply called as selection transistors (STD, STS).

The memory string MS includes a plurality of memory cells MC connected in series. The memory cell MC according to this embodiment is a field effect type transistor (memory transistor) including: a semiconductor layer functioning as a channel region; a gate insulating film including a charge accumulation film; and a gate electrode. A threshold voltage of the memory cell MC varies according to an amount of charge in the charge accumulation film. Note that each of the gate electrodes of the plurality of memory cells MC belonging to one memory string MS is connected to a word line WL. These word lines WL are commonly connected to all of the memory units MU in one memory block MB.

Each of the selection transistors (STD, STS) is a field effect type transistor including: a semiconductor layer functioning as a channel region; a gate insulating film; and a gate electrode. Each of the gate electrodes of the selection transistors (STD, STS) is connected to selection gate lines (SGD, SGS) respectively. The drain selection line SGD is correspondingly provided to the memory finger MF and is commonly connected to all of the memory units MU in one memory finger MF. The source selection line SGS is commonly connected to all of the memory units MU in one memory block MB.

The peripheral circuit PC includes: an operation voltage generating circuit 21 that generates an operation voltage; an address decoder 22 that decodes address data; a block selection circuit 23 and a voltage selection circuit 24 that transfer the operation voltage to the memory cell array MA in response to an output signal of the address decoder 22; a sense amplifier 25 connected to the bit lines BL; and a sequencer 26 for controlling them.

The operation voltage generating circuit 21 includes a plurality of operation voltage output terminals 31. For example, the operation voltage generating circuit 21 generates a plurality of kinds of operation voltages applied to the bit lines BL, the source line SL, the word lines WL and the selection gate lines (SGD, SGS) at a time of a read operation, a write operation, and an erase operation on the memory cell array MA in accordance with a control signal from the sequencer 26, and outputs the operation voltages to the plurality of operation voltage output terminals 31.

The address decoder 22 includes a plurality of block selection lines 32 and a plurality of voltage selection lines 33. For example, the address decoder 22 refers to address data of an address register sequentially in accordance with a control signal from the sequencer 26, and decodes the address data to set a certain block selection line 32 and voltage selection line 33 corresponding to the address data to an "H" state, and, set the other block selection lines 32 and voltage selection lines 33 to an "L" state.

The block selection circuit 23 includes a plurality of block selection sections 34 corresponding to the memory blocks MB. Each of the plurality of block selection sections 34 includes a plurality of block selection transistors 35 corresponding to the word lines WL and the selection gate lines (SGD, SGS). The block selection transistor 35 is a field effect type high withstand voltage transistor, for example. Each of one ends of the block selection transistors 35 is electrically connected to a corresponding word line WL or selection gate lines (SGD, SGS). Each of the other ends of the block selection transistors 35 is electrically connected to the operation voltage output terminals 31 via a wiring CG and the voltage selection circuit 24. Gate electrodes of the block selection transistors 35 are commonly connected to a corresponding block selection line 32.

The voltage selection circuit 24 includes a plurality of voltage selection sections 36 corresponding to the word lines WL and the selection gate lines (SGD, SGS). Each of the plurality of voltage selection sections 36 includes a plurality of voltage selection transistors 37. Each voltage selection transistor 37 is a field effect type high withstand voltage transistor, for example. Each of one ends of the voltage selection transistors 37 is electrically connected to a corresponding word line WL or selection gate lines (SGD, SGS) via the wiring CG and the block selection circuit 23. Each of the other ends of the voltage selection transistors 37 is connected to a corresponding operation voltage output terminal 31. Each of gate electrodes of the voltage selection transistors 37 is connected to a corresponding voltage selection line 33.

The sense amplifier 25 is connected to a plurality of bit lines BL. For example, the sense amplifier 25 includes a plurality of sense amplifier units corresponding to the bit lines BL. Each of the sense amplifier units includes: a clamp transistor which charges the bit lines BL based on a generated voltage in the operation voltage generating circuit 21; a sense circuit which senses a voltage or a current of the bit lines BL; a plurality of latches which holds an output signal of this sense circuit, write data and a verify pass flag etc.; and a logic circuit. The logic circuit specifies data held in the memory cell MC with reference to data held in the latches in a read operation, for example. Also, the logic circuit controls a voltage of the bit lines BL with reference to data held in the latches in a write operation, for example.

The sequencer 26 outputs a control signal to the operation voltage generating circuit 21, the address decoder 22 and the sense amplifier 25 in accordance with an inputted command and the state of the semiconductor memory device. For example, the sequencer 26 refers to command data of a command register sequentially in accordance with a clock signal, and decodes the command data to output it to the operation voltage generating circuit 21, the address decoder 22 and the sense amplifier 25.

Figure 2:
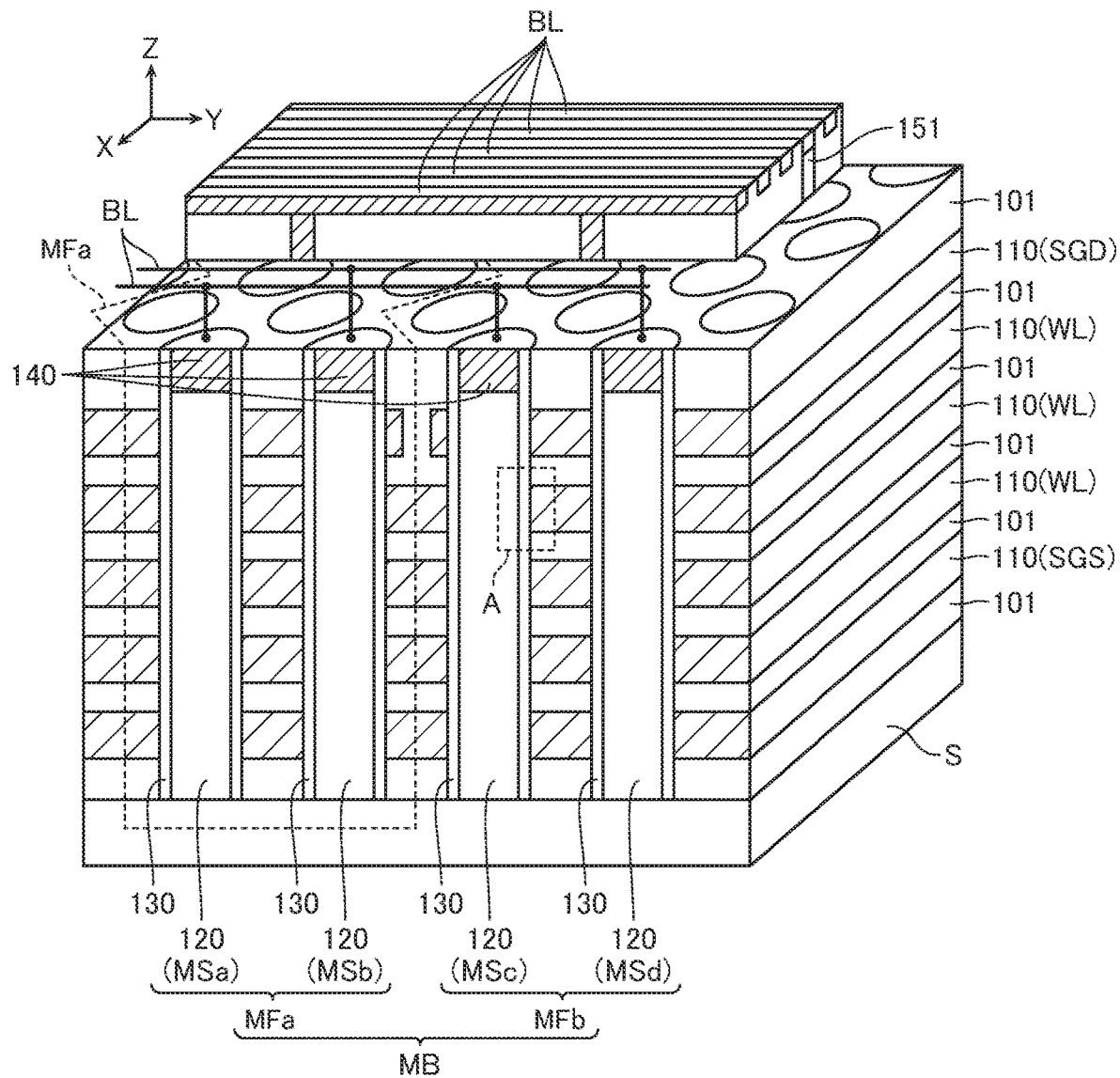
FIG. 2 shows a schematic perspective view of the semiconductor memory device.
Figure 3:
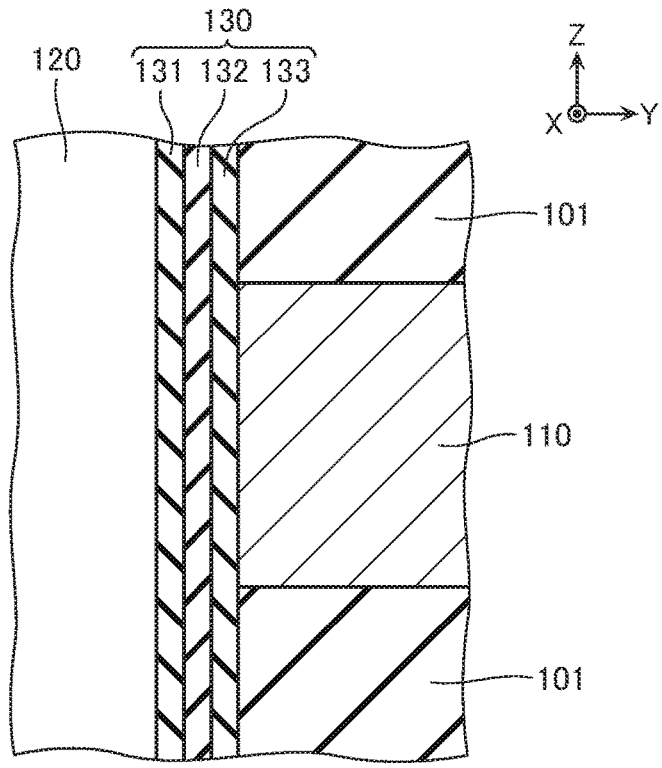
FIG. 3 shows a schematic enlarged view of FIG. 2.

Next, with reference to FIGS. 2 and 3, a configuration example of the semiconductor memory device according to this embodiment will be explained. FIG. 2 is a schematic perspective view of the semiconductor memory device according to this embodiment, and FIG. 3 is a schematic enlarged view of a portion shown by A of FIG. 2.

As shown in FIG. 2, the semiconductor memory device according to this embodiment includes: a substrate S; a plurality of conductive layers 110 arranged in a Z direction; a plurality of semiconductor columns 120 extending in the Z direction; a gate insulation film 130 provided between each conductive layer 110 and each semiconductor column 120; a semiconductor film 140 connected to an upper end of each semiconductor column 120; and a bit line BL provided above these configurations.

The substrate S is a semiconductor substrate of the likes of single crystal silicon (Si), for example. The substrate S has, for example, a double well structure having an n type impurity layer on an upper surface of the semiconductor substrate and further having a p type impurity layer in this n type impurity layer. Note that, in this embodiment, the substrate S is used as a source line SL. However, other than the substrate S, a wiring etc. which functions as a source line SL may be additionally provided.

Each conductive layer 110 is, as shown in FIG. 2, a substantially plate-like conductive layer arranged in the Z direction via an insulation layer 101 of silicon oxide ($SiO_2$) etc. and extending in the X direction. The conductive layer 110 includes a laminated film of titanium nitride (TiN) and tungsten (W), for example.

The conductive layer 110 positioned at a lowermost layer functions as the source selection line SGS (FIG. 1) and a gate electrode of a plurality of source selection transistors STS connected thereto. Also, the conductive layers positioned above function as the word line WL (FIG. 1) and a plurality of gate electrodes of memory cells MC (FIG. 1) connected thereto. Also, the conductive layers positioned further above function as the drain selection line SGD and a plurality of gate electrodes of drain selection transistors STD (FIG. 1) connected thereto. The conductive layers 110 functioning as the drain selection lines SGD etc. have a narrower width in the Y direction than that of the other conductive layers 110, and are arranged in the Y direction corresponding to the memory finger MF.

A plurality of the semiconductor columns 120 are arranged in the X direction and the Y direction. The semiconductor column 120 has substantially cylindrical shape or substantially circular columnar shape. Also, an outer peripheral surface of the semiconductor column 120 is surrounded by the conductive layer 110 and an insulation layer 101, respectively, and a lower end of the semiconductor column 120 is connected to the substrate S. Each semiconductor column 120 functions as channel regions of the plurality of memory cells MC and the selection transistors (STD, STS) included in one memory unit MU (FIG. 1). The semiconductor column 120 is a semiconductor film of non-doped polycrystalline silicon (p-Si), for example.

Note that, in this embodiment, the lower end of the semiconductor column 120 is connected to the substrate S. However, the lower end of the semiconductor column 120 is not necessarily connected to the substrate S. For example, when a wiring which functions as the source line SL is provided other than the substrate S as described before, the lower end of the semiconductor column 120 may be connected to this wiring.

The gate insulation film 130 includes, as shown in FIG. 3 for example, a tunnel insulating film 131, a charge accumulation film 132, and a block insulating film 133 laminated between the semiconductor column 120 and the conductive layer 110. The tunnel insulating film 131 and the block insulating film 133 are insulation films of silicon oxide ($SiO_2$) etc., for example. The charge accumulation film 132 is a charge-accumulable film of silicon nitride (SiN), for example.

Although FIG. 3 shows a structure of the gate insulation film 130 corresponding to the memory cell MC, in this embodiment, the gate insulation film corresponding to the drain selection transistor STD has a similar structure. The gate insulation film corresponding to the source selection transistor STS may have a similar structure, or may have a different structure.

Also, although FIG. 3 shows an example that the gate insulation film 130 includes the charge accumulation film 132 of silicon nitride etc., the gate insulation film 130 may, for example, include a floating gate of polycrystalline silicon, etc.

The semiconductor film 140 (FIG. 2) is, for example, a semiconductor film of polycrystalline silicon (p-Si) etc. including n type impurity such as phosphorus.

A plurality of bit lines BL is arranged in the X direction and extend in the Y direction. The bit lines BL are electrically connected to the plurality of semiconductor columns 120 via a contact 151.

In the following explanation, the memory strings MS corresponding to four of the plurality of semiconductor columns 120 shown in FIG. 2 are sometimes called as memory strings MSa, MSb, MSc and MSd. The memory strings MSa and MSb are included in the same memory finger MFa, and the memory strings MSc and MSd are included in the same memory finger MFb. Also, these memory fingers MFa, MFb are included in the same memory block MB. Further, the memory strings MSa, MSc are electrically connected to the same bit line BL, and the memory strings MSb, MSd are electrically connected to the same bit line BL.

Figure 4:
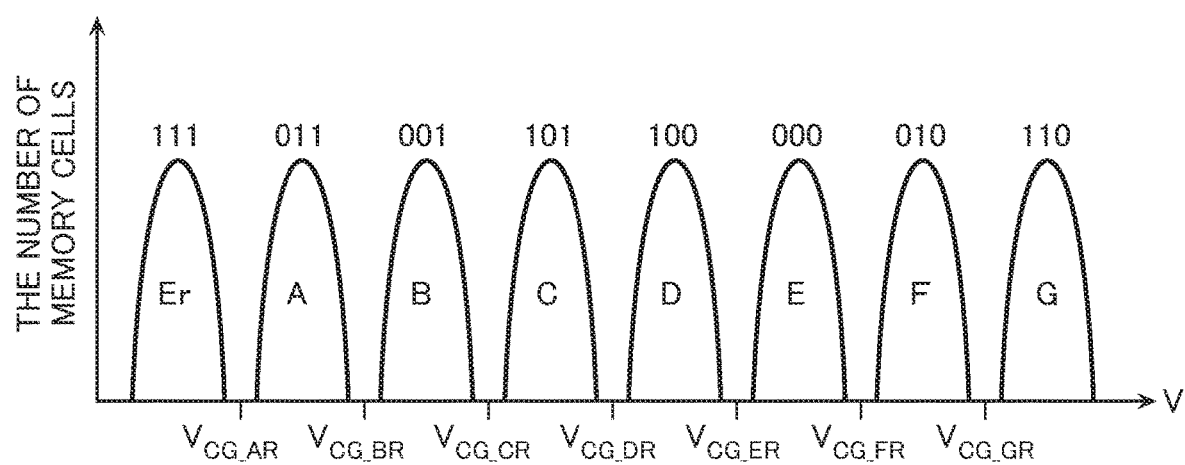
FIG. 4 shows a schematic histogram showing distribution of a threshold voltage of a memory cell MC.

Next, with reference to FIG. 4, a threshold voltage of the memory cell MC will be explained. FIG. 4 is a schematic histogram for explaining a threshold voltage of the memory cell MC. The abscissa shows a voltage of the word line WL, and the ordinate shows the number of memory cells MC.

As described above, the memory cell array MA includes the plurality of memory cells MC. When a write operation is executed to the plurality of memory cells MC, threshold voltages of these memory cells MC are distributed to a plurality of kinds of ranges (eight kinds of ranges in an example of FIG. 4). For example, a threshold voltage of the plurality of memory cells MC corresponding to distribution shown in A of FIG. 4 is larger than a voltage $V_{CG\_AR}$ and smaller than a voltage $V_{CG\_BR}$.

In this embodiment, three-bit data is stored in each memory cell MC by adjusting amount of charges in the gate insulation film 130 of the memory cell MC to eight kinds of ranges.

Distribution Er in the drawing corresponds to the smallest threshold voltage (a threshold voltage of the memory cell MC in an erase state). Data "111" is assigned to the memory cell MC corresponding to the distribution Er, for example.

Distribution A in the drawing corresponds to a threshold voltage which is larger than the threshold voltage corresponding to the above distribution Er. Data "011" is assigned to the memory cell MC corresponding to the distribution A, for example.

Distribution B in the drawing corresponds to a threshold voltage which is larger than the threshold voltage corresponding to the above distribution A. Data "001" is assigned to the memory cell MC corresponding to the distribution B, for example.

In the same manner, distributions C to G in the drawing respectively correspond to threshold values which are higher than those of distributions B to F. Data "101," "100," "000," "010" and "110" is assigned to the memory cells MC corresponding to these distributions, for example.

When data is read from these memory cells MC, a voltage with the magnitude between two of these distributions may be applied to the word line WL.

For example, when data of a lower bit of the memory cell MC is read, a voltage $V_{CG\_DR}$ in FIG. 4 is applied to the word line WL. By doing this, a memory cell MC being in an ON state can be judged as a memory cell MC corresponding to data "1" (a memory cell MC corresponding to distributions Er, A, B and C). On the other hand, a memory cell MC being in an OFF state can be judged as a memory cell MC corresponding to data "0" (a memory cell MC corresponding to distributions D, E, F and G).

Also, for example, when data of an intermediate bit of the memory cell MC is read, voltages $V_{CG\_BR}$, $V_{CG\_FR}$ in FIG. 4 are sequentially applied to the word line WL. For example, a memory cell MC being in an ON state when the voltage $V_{CG\_BR}$ is applied can be judged as a memory cell MC corresponding to data "1" (a memory cell MC corresponding to distributions Er and A). Also, for example, a memory cell MC being in an OFF state when the voltage $V_{CG\_BR}$ is applied while turning into an ON state when the voltage $V_{CG\_FR}$ is applied can be judged as a memory cell MC corresponding to data "0" (a memory cell MC corresponding to distributions B, C, D and E). Moreover, a memory cell MC being in an OFF state in such a case can be judged as a memory cell MC corresponding to data "1" (a memory cell MC corresponding to distributions F and G).

Moreover, for example, when data of an upper bit of the memory cell MC is read, voltages $V_{CG\_AR}$, $V_{CG\_CR}$, $V_{CG\_ER}$ and $V_{CG\_GR}$ in FIG. 4 are sequentially applied to the word line WL. By doing this, in accordance with ON/OFF of the memory cell MC, the memory cell MC corresponding to data "1" and the memory cell MC corresponding to data "0" can be judged.

Note that such a data assignment and such an order of the applied voltage etc. are merely illustrative, and can be appropriately changed.

[Read Operation]

Next, with reference to FIG. 5 etc., a read operation of the semiconductor memory device according to this embodiment will be explained more specifically.

Note that an explanation will be made on an example of executing a read operation to a memory cell MC included in the memory finger MFa in FIG. 2, hereinafter.

Also, in the following explanation, a memory cell MC to be operated is called as "a selected memory cell MC," and the other memory cells are called as "a non-selected memory cell MC." Also, a word line WL connected to the selected memory cell MC is called as "a selected word line WL," and the other word lines WL are called as "a non-selected word line WL." Moreover, a memory finger MF or a memory block MB including the selected memory cell MC is called as "a selected memory finger MF" or "a selected memory block MB," respectively, and the other memory fingers MF or the other memory blocks MB are called as "a non-selected memory finger MF" or "a non-selected memory block MB," respectively.

Figure 5:
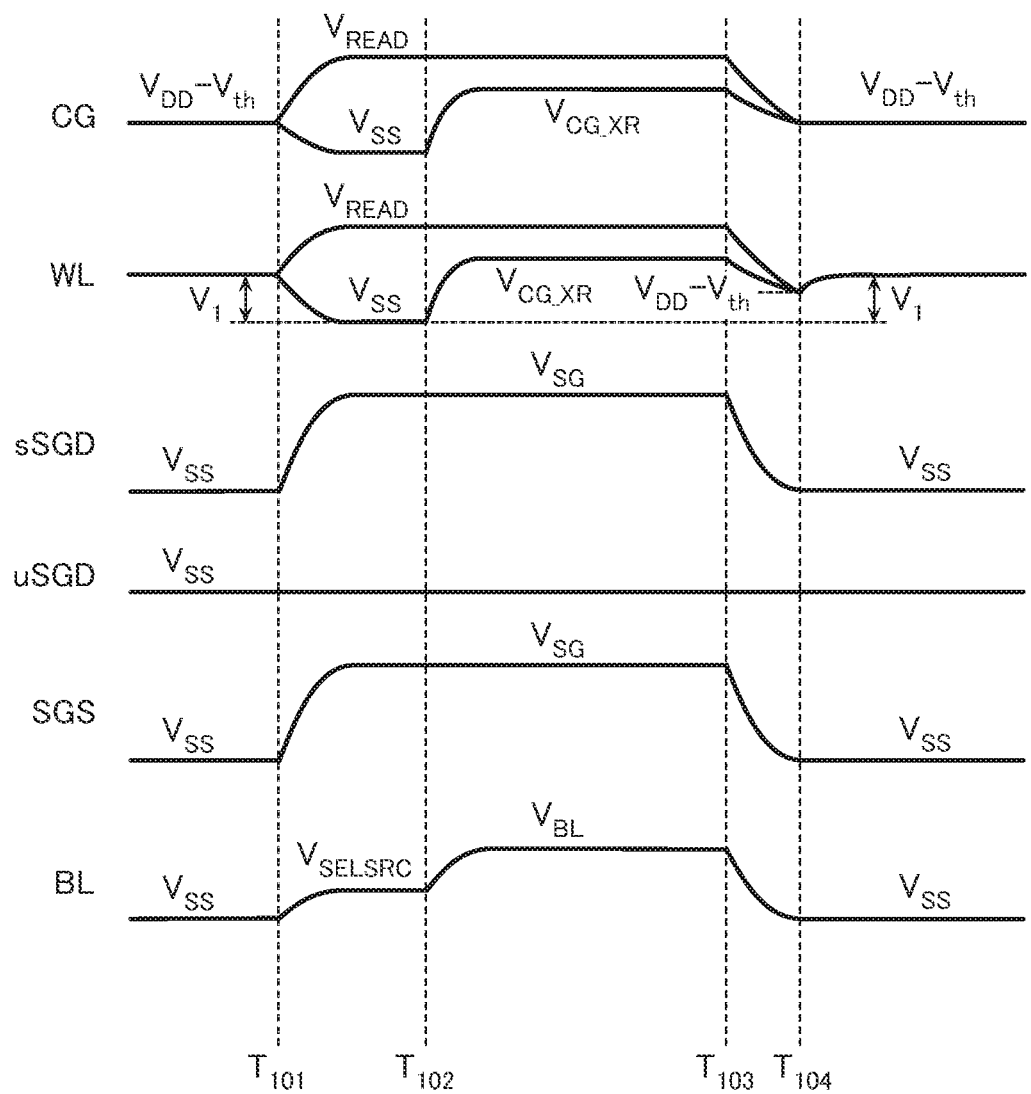
FIG. 5 shows a schematic waveform diagram showing a read operation according to the first embodiment.

Also, "CG" in FIG. 5 shows one of the plurality of wirings CG shown in FIG. 1 corresponding to the word line WL. Moreover, "sSGD" in FIG. 5 shows the drain selection line SGD corresponding to a selected memory finger MFa (FIG. 2). In addition, "uSGD" shows the drain selection line SGD corresponding to a non-selected memory finger MFb (FIG. 2).

As shown in FIG. 5, in the read operation according to this embodiment, a voltage of the word line WL is previously charged to approximately a voltage $V_1$. Also, a voltage of the wiring CG is previously charged to approximately a voltage $V_{DD}$-$V_{th}$. Voltages of the other wirings are set to a voltage $V_{ss}$. The voltage $V_{ss}$ is approximately a voltage on a low-voltage side of a power voltage, for example. A voltage $V_{DD}$ is approximately a voltage on a high-voltage side of the power voltage, for example. A voltage $V_{th}$ is approximately a threshold voltage of a transistor with the largest threshold voltage among the plurality of transistors electrically connected between a pad electrode to which a voltage on the high-voltage side of the power voltage is supplied and the word line WL, for example. Such transistor may be the voltage selection transistor 37 (FIG. 1) or any transistor included in the operation voltage generating circuit 21 (FIG. 1).

In the read operation, a control signal is outputted from the sequencer 26 to control the address decoder 22 (FIG. 1) to select a selected word line WL. That is, address data of the address register is decoded by the address decoder 22 to set a block selection line 32 corresponding to a selected memory block MB to an "H" state, and set the other block selection lines 32 to an "L" state. This allows for conduction between the word line WL corresponding to the selected memory block MB and the wiring CG. Also, a voltage selection line 33 corresponding to the address data is set to an "H" state, and the other voltage selection lines 33 are set to an "L" state. This allows for conduction between the wiring CG connected to the selected word line WL and a certain operation voltage output terminal 31, and, conduction between the wirings CG connected to non-selected word lines WL and other operation voltage output terminals 31.

Also, by outputting a control signal from the sequencer 26 for control of the operation voltage generating circuit 21 in order to execute voltage rise and fall of the operation voltage output terminal 31 sequentially, a voltage of the wiring CG etc. is controlled as follows.

As shown in FIG. 5, at timing $T_{101}$, voltages of the non-selected word lines WL and the wirings CG connected thereto are raised to a voltage $V_{READ}$. Also, voltages of the selected word line WL and the wiring CG connected thereto are lowered to a voltage $V_{ss}$. Also, voltages of the drain selection line sSGD and the source selection line SGS are raised to a voltage $V_{SG}$. Also, a voltage of the bit line BL is raised to a voltage $V_{SELSRC}$.

Note that the voltage $V_{READ}$ is larger than the voltage $V_{SS}$, and has the magnitude to the extent that the memory cell MC is in an ON state irrespective of data recorded in the memory cell MC. Also, the voltage $V_{SG}$ is larger than the voltage $V_{SS}$, and has the magnitude to the extent that the selection transistors (STD, STS) are in an ON state.

At this time, an electronic channel is formed in the non-selected memory cells MC in the memory strings MSa and MSb. The channel of the memory cell MC located closer to the bit line BL than the selected memory cell MC is conducted with the bit line BL, with a voltage approximate to that of the bit line BL. The channel of the memory cell MC located closer to the source line SL than the selected memory cell MC is conducted with the source line SL, with a voltage approximate to that of the source line SL.

Next, at timing $T_{102}$, voltages of the selected word line WL and the wiring CG connected thereto are raised to a voltage $V_{CG\_XR}$ (X is any of A to G, see FIG. 4). Also, the voltage of the bit line BL is raised to a voltage $V_{BL}$. The voltage $V_{BL}$ is larger than the voltage $V_{SELSRC}$.

By doing this, in accordance with the threshold voltage of the memory cell MC, the selected memory cell MC is turned into an ON state or an OFF state. In the memory string MS in which the selected memory cell MC is turned ON, the bit line BL is conducted with the source line SL, a charge of a sense node of the sense amplifier 25 flows to the source line SL via the bit line BL, whereby a voltage of the sense node decreases. On the other hand, in the memory string MS in which the selected memory cell MC is not turned ON, the bit line BL is not conducted with the source line SL, whereby a voltage of the sense node of the sense amplifier 25 is not changed. The sense amplifier 25 (FIG. 1) reads the voltage of the sense node based on a strobe signal, for example, and latches it as data.

Next, at timing $T_{103}$, voltages of the wiring CG and the word line WL are lowered to the voltage $V_{DD}$-$V_{th}$. Also, voltages of the selection gate lines (sSGD, SGS) are lowered to the voltage $V_{ss}$.

Here, when the voltage of the word line WL falls, due to capacitance coupling, a voltage of the channel of the semiconductor column 120 is also lowered. At this time, since the memory cell MC and the selection transistors (STD, STS) are all in an OFF state, electrons remain in the semiconductor column 120. As a result, the voltage of the channel of the semiconductor column 120 is significantly lowered. Note that remained electrons gradually escape to the bit line BL and the source line SL as a leak current via the selection transistors (STD, STS).

Next, at timing $T_{104}$, the wiring CG is electrically disconnected from the word line WL. Due to this, the word line WL is in a floating state.

Here, when the electrons in the semiconductor column 120 escape to the bit line BL and the source line SL, a voltage of the semiconductor column 120 increases. Here, the word line WL is in a floating state. Accordingly, when the voltage of the semiconductor column 120 is raised, the voltage of the word line WL is also raised approximately to the voltage $V_1$ due to capacitance coupling. In the present specification, such phenomenon is called as "creep up."

In the same manner hereinafter, processing at timings $T_{101}$ to $T_{103}$ is repeatedly performed with adjusting the voltage $V_{CG\_XR}$ applied to the selected word line WL at timing $T_{102}$. Thereafter, the sense amplifier 25 (FIG. 1) transfers the latched data to an input and output buffer.

[Write Operation]

Next, with reference to FIG. 6, a write operation of the semiconductor memory device according to this embodiment will be explained.

Note that, in the following explanation, an example in which a write operation is executed to the memory cell MC included in the memory finger MFa of FIG. 2 will be explained.

In the write operation, a control signal is outputted from the sequencer 26 (FIG. 1) for control of the address decoder 22 (FIG. 1) to select a selected word line WL.

Also, a control signal is outputted from the sequencer 26 for control of the sense amplifier 25 (FIG. 1) to hold writing data in a latch of a sense amplifier unit. Also, in accordance with the value etc. held in the latch, a voltage to be applied to the bit line BL is adjusted. For example, no adjustment of a threshold voltage is needed for the memory cell MC corresponding to the distribution Er of FIG. 4 or the memory cell MC whose threshold voltage has already reached a desired distribution. A voltage of the bit line BL connected to such memory cell MC is set to a voltage $V_{DDSA}$. On the other hand, an adjustment of a threshold voltage is needed for the memory cell MC whose threshold voltage has not yet reached a desired distribution. A voltage of the bit line BL connected to such memory cell MC is set to a voltage $V_{ss}$. Note that the voltage $V_{DDSA}$ is larger than the voltage $V_{SS}$.

Also, by outputting a control signal from the sequencer 26 for control of the operation voltage generating circuit 21 in order to execute voltage rise and fall of the operation voltage output terminal 31 sequentially, a voltage of the wiring CG etc. is controlled as follows.

Figure 6:
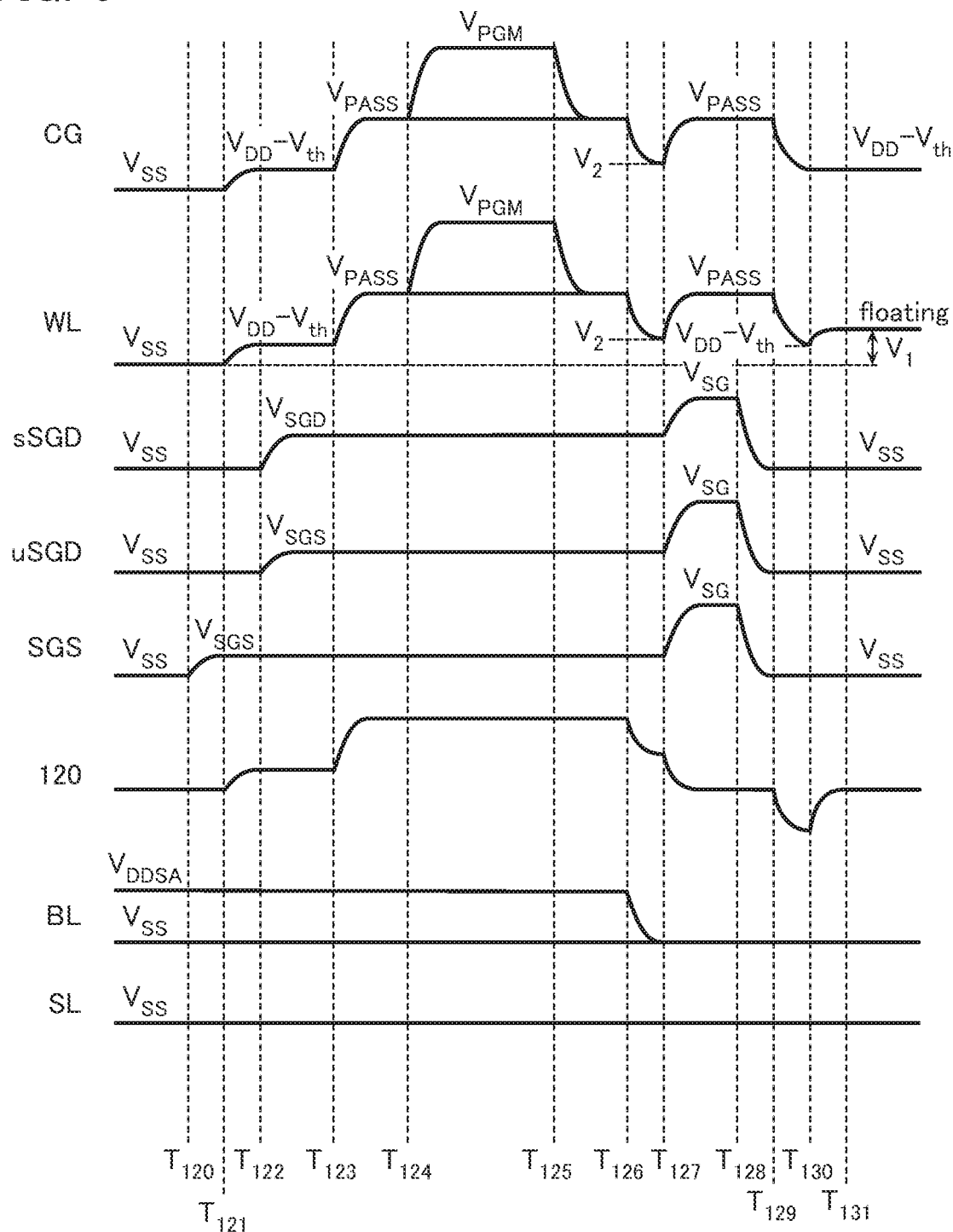
FIG. 6 shows a schematic waveform diagram showing a write operation according to the first embodiment.

As shown in FIG. 6, at timing $T_{120}$, a voltage of the source selection line SGS is raised to a voltage $V_{SGS}$. The voltage $V_{SGS}$ is smaller than the voltage $V_{SG}$, and has the magnitude to the extent that the selection transistors (STD, STS) are not in an ON state.

Next, at timing $T_{121}$, voltages of the wiring CG and the word line WL are raised to the voltage $V_{DD}$-$V_{th}$.

Next, at timing $T_{122}$, a voltage of the drain selection line uSGD is raised to the voltage $V_{SGS}$. Also, a voltage of the drain selection line sSGD is raised to a voltage $V_{SGD}$. The voltage $V_{SGD}$ is larger than the voltage $V_{SS}$, and has the magnitude to the extent that the drain selection transistor STD is in an ON state in accordance with the voltage of the bit line BL.

At this time, in the drain selection transistor STD of the memory string MSa, the voltage $V_{SGD}$ is applied to the gate electrode and the voltage $V_{ss}$ is applied to the drain electrode. Due to this, the drain selection transistor STD is in an ON state. On the other hand, in the drain selection transistor STD of the memory string MSb, the voltage $V_{SGD}$ is applied to the gate electrode and the voltage $V_{DDSA}$ is applied to the drain electrode. Due to this, the drain selection transistor STD is in an OFF state. In the same manner, the drain selection transistors STD of the memory strings MSc and MSd are also in an OFF state.

Next, at timing $T_{123}$, voltages of the wiring CG and the word line WL are raised to a voltage $V_{PASS}$. The voltage $V_{PASS}$ is larger than the voltage $V_{SGS}$, and has the magnitude to the extent that the memory cell MC is in an ON state irrespective of data stored in the memory cell MC. Note that the voltage $V_{PASS}$ may be larger than the voltage $V_{READ}$ or may be the same as the voltage $V_{READ}$.

At this time, an electronic channel is formed in the memory cells MC of the memory strings MSa, MSb, MSc and MSd. Also, in the memory string MSa, the channel of the memory cell MC is conducted with the bit line BL, and electrons are supplied from the bit line BL. On the other hand, in the memory strings MSb, MSc and MSd, the channels of the memory cells MC are not conducted with the bit line BL, and these channels are in a floating state. Accordingly, voltages in these channels increase due to capacitance coupling with the word line WL.

Next, at timing $T_{124}$, voltages of the selected word line WL and the wiring CG connected thereto are raised to a voltage $V_{PGM}$. The voltage $V_{PGM}$ is larger than the voltage $V_{PASS}$, and has the magnitude to the extent that electrons of the channel of the memory cell MC are allowed for tunneling in the charge accumulation film 132 of the gate insulation film 130.

Due to this, in the selected memory cell MC in the memory string MSa, the electric field between the channel and the word line WL exceeds a certain value, and electrons in the channel of the selected memory cell MC execute tunneling in the gate insulation film 130, which increases a threshold voltage of the selected memory cell MC. Note that voltages in the channels of the memory cells MC in the memory strings MSb, MSc and MSd increase due to capacitance coupling with the word line WL. Consequently, the electric field between the channel and the word line WL does not exceed a certain value, so that no electron tunneling is generated.

Next, at timing $T_{125}$, voltages of the wiring CG and the word line WL are lowered to the voltage $V_{PASS}$.

Next, at timing $T_{126}$, the voltage of the bit line BL is lowered to the voltage $V_{SS}$. Also, voltages of the wiring CG and the word line WL are lowered to a voltage $V_2$. The voltage $V_2$ is larger than the voltage $V_{SS}$ and smaller than the voltage $V_{PASS}$. Due to this, voltages of the channels of the memory cells MC in the memory strings MSb, MSc and MSd are lowered.

Next, at timing $T_{127}$, voltages of the selection gate lines (sSGD, uSGD, SGS) are raised to the voltage $V_{SG}$. Also, voltages of the wiring CG and the word line WL are again raised to the voltage $V_{PASS}$.

Due to this, the channels of all the memory cells MC are conducted with both the bit line BL and the source line SL. Also, electrons are supplied to all the channels from both the bit line BL and the source line SL, voltages of these channels are lowered to approximately the voltage $V_{SS}$.

Next, at timing $T_{128}$, voltages of the selection gate lines (sSGD, uSGD, SGS) are lowered to the voltage $V_{SS}$.

Due to this, the channel of the memory cell MC is electrically disconnected from the bit line BL and the source line SL, and in a floating state.

Next, at timing $T_{129}$, voltages of the wiring CG and the word line WL are lowered to the voltage $V_{DD}$-$V_{th}$.

Here, the channel of the memory cell MC is in a floating state. Accordingly, when the voltage of the word line WL is lowered, due to capacitance coupling, the voltage of the channel is also lowered. Note that electrons in the channel gradually escape to the bit line BL and the source line SL via the selection transistors (STD, STS).

Next, at timing $T_{130}$, the wiring CG is electrically disconnected from the word line WL. By doing this, the word line WL is in a floating state.

Here, when the electrons in the channel of the memory cell MC escape to the bit line BL and the source line SL, a voltage of the channel increases. Here, the word line WL is in a floating state. Accordingly, when the voltage of the channel is raised, a voltage of the word line WL is also raised approximately to the voltage $V_1$ due to capacitance coupling.

Next, verify processing which is similar to the above read operation will be executed. Basically, verify processing is executed in the same manner as the read operation. At timing $T_{102}$, a verify voltage which is different from the voltage $V_{CG\_XR}$ may be applied. Next, whether a threshold voltage of each memory cell MC reaches a desired distribution is judged, and the result of judgment is stored in the latch of the sense amplifier unit. In the same manner hereinafter, processing at timings $T_{120}$ to $T_{130}$ and verify processing are repeated a predetermined number of times.

[First Comparable Example]

Figure 7:
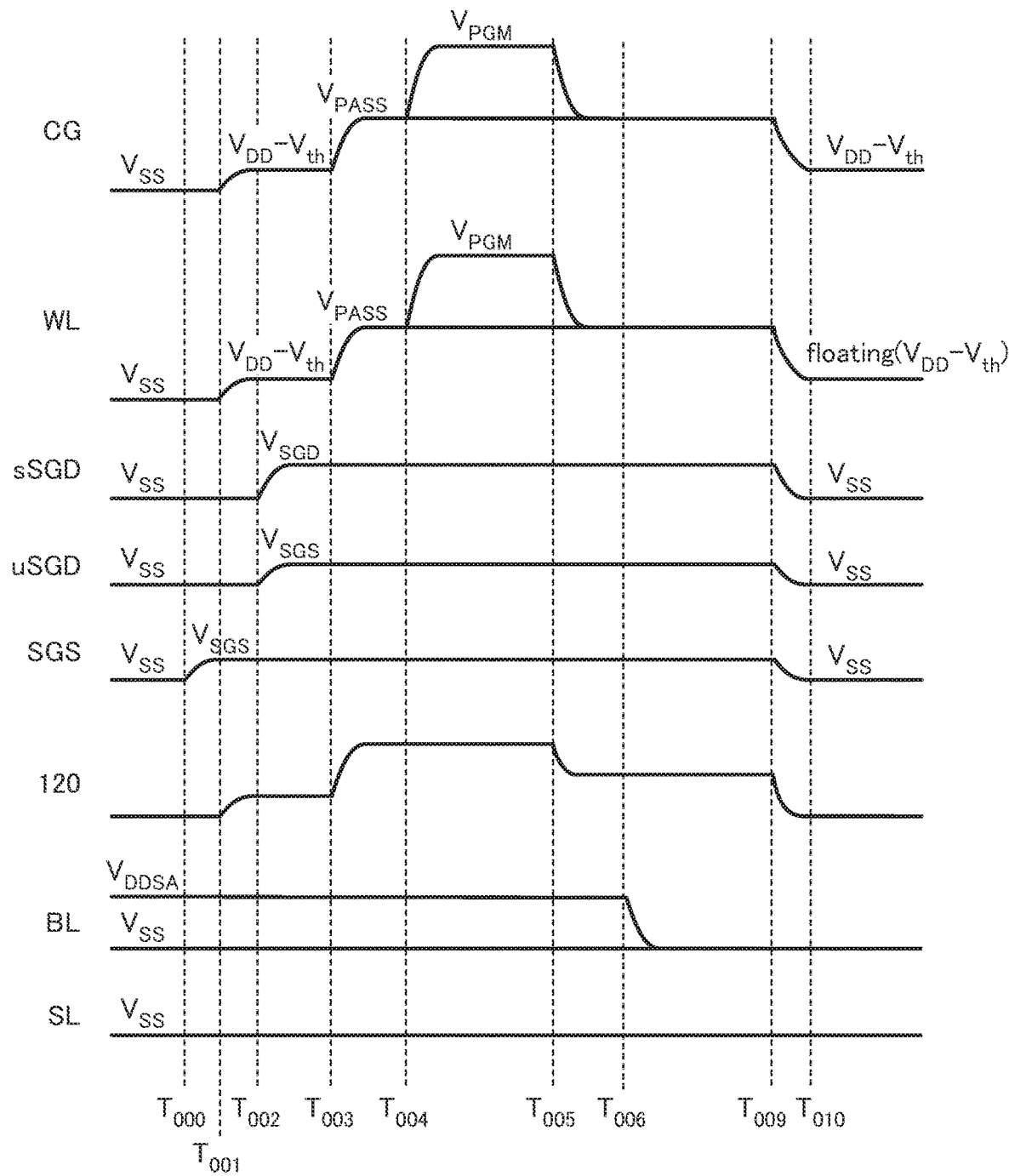
FIG. 7 shows a schematic waveform diagram showing a write operation according to a first comparative example.

Next, a write operation of the semiconductor memory device according to a first comparative example will be explained with reference to FIG. 7. Note that, in the following explanation, portions similar to in the first embodiment will be assigned with identical symbols to those assigned in the first embodiment, and descriptions thereof will be omitted.

The write operation according to the first comparable example is executed substantially in the same manner as the write operation according to the first embodiment. Also, processing at timing $T_{000}$ to $T_{005}$ of the writing operation according to the first comparable example is the same as processing at timing $T_{120}$ to $T_{125}$ of the write operation according to the first embodiment. Moreover, in the write operation according to the first comparative example, processing at timing $T_{126}$ to $T_{129}$ of the write operation according to the first embodiment is not executed, and at timing $T_{009}$, voltages of the wiring CG and the word line WL are lowered to the voltage $V_{DD}$-$V_{th}$. Also, the voltages of the selection gate lines (sSGD, uSGD, SGS) are simultaneously lowered to the voltage $V_{SS}$.

Here, as explained with reference to FIG. 6, in the write operation according to the first embodiment, at timing $T_{131}$, the voltage of the word line WL is raised to approximately the voltage $V_1$. On the other hand, in the write operation according to the first comparative example, the voltage of the word line WL little increases, and sometimes becomes approximately the voltage $V_{DD}$-$V_{th}$. For example, the semiconductor memory device may be instructed to interrupt a write operation and to perform a read operation. Depending on timing when interruption of the write operation is instructed, there is a case where no verify processing is executed after completion of processing of FIG. 7. In this case, the read operation is executed in a state that the voltage of the word line WL remains approximately the voltage $V_{DD}$-$V_{th}$ at timing $T_{010}$ in FIG. 7.

The timing or magnitude of the voltage applied to the word line WL etc. in the read operation of the semiconductor memory device is set with the premise of a state in FIG. 5. However, when the write operation is interrupted as above, the read operation is executed in a different state from that in FIG. 5. Due to this, for example, there is a possibility that the state of the memory cell MC varies when the voltage $V_{CG\_XR}$ is applied to the word line WL, which may result in erroneous reading.

[Read Operation According to Second Comparative Example]

Figure 8:
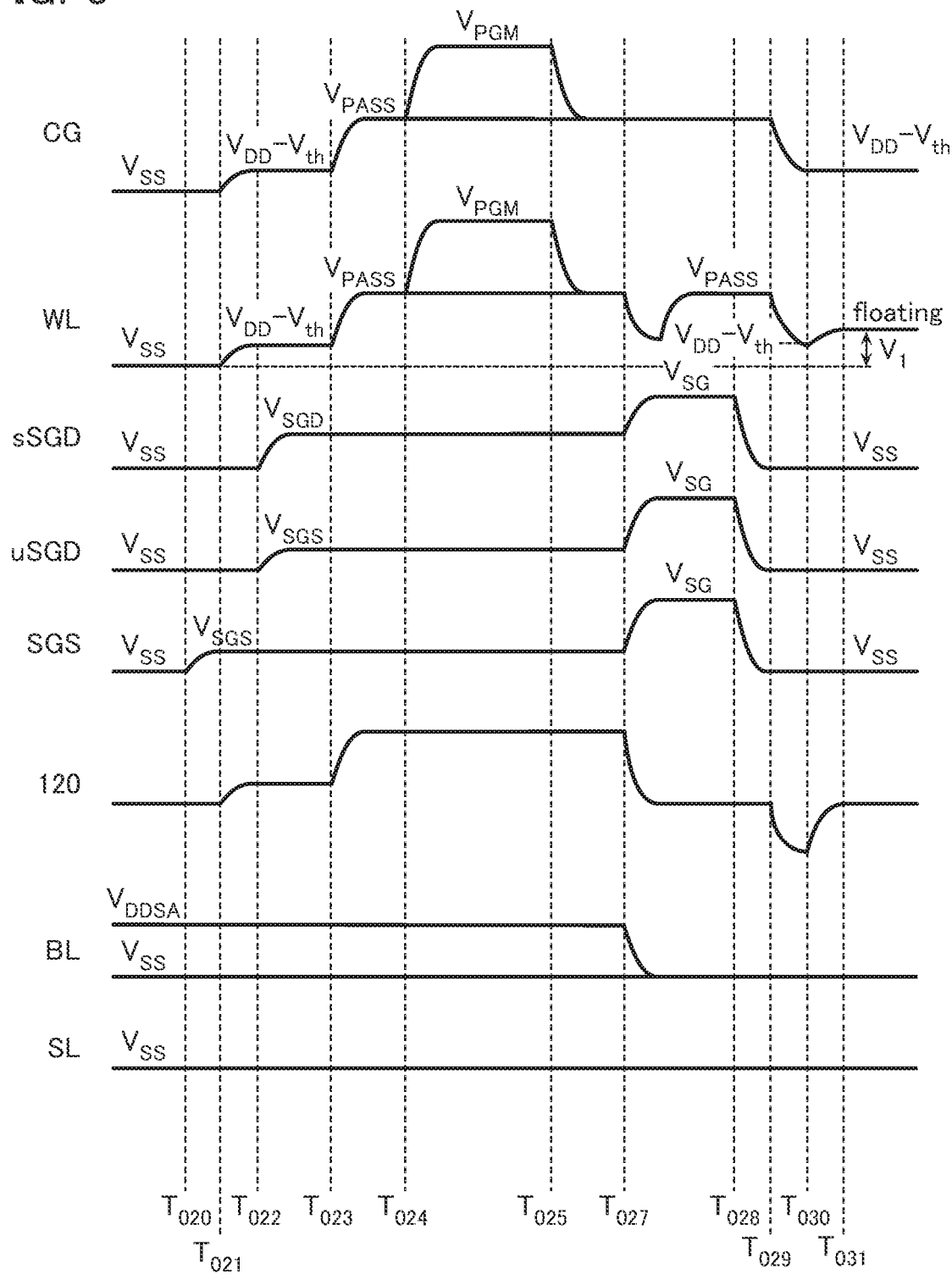
FIG. 8 shows a schematic waveform diagram showing a write operation according to a second comparative example.

Next, a write operation of the semiconductor memory device according to a second comparative example will be explained with reference to FIG. 8. Note that, in the following explanation, portions similar to in the first embodiment will be assigned with identical symbols to those assigned in the first embodiment, and descriptions thereof will be omitted.

The write operation according to the second comparative example is executed substantially in the same manner as the write operation according to the first embodiment. Also, processing at timing $T_{020}$ to $T_{025}$ of the write operation according to the second comparative example is similar to processing at timing $T_{120}$ to $T_{125}$ of the write operation according to the first embodiment. Moreover, processing at timing $T_{027}$ to $T_{030}$ of the write operation according to the second comparative example is similar to processing at timing $T_{127}$ to $T_{130}$ of the write operation according to the first embodiment. Note that, at timing $T_{027}$, the voltage of the word line WL is lowered. This shows that, at timing $T_{027}$, the voltage of the channel of the memory cell MC is rapidly lowered and the voltage of the word line WL is lowered due to capacitance coupling.

Note that, in the write operation according to the second comparative example, processing at timing $T_{126}$ of the write operation according to the first embodiment is not executed.

In the write operation according to the second comparative example, at timing $T_{027}$ to $T_{030}$, similar processing as processing at timing $T_{127}$ to $T_{130}$ of the write operation according to the first embodiment is executed. Due to this, at timing $T_{031}$, a voltage of the word line WL increases to approximately the voltage $V_1$. Accordingly, the voltage of the word line WL immediately after the write operation is likely to be close to the voltage of the word line WL immediately after the read operation (see FIG. 6), thereby avoiding erroneous reading.

On the other hand, in the write operation according to the second comparative example, at timing $T_{025}$, voltages of all the wirings CG and the word lines WL are set to the voltage $V_{PASS}$. Here, the channels of the memory cells MC in the memory strings MSb, MSc and MSd are in a floating state. Accordingly, voltages of these channels increase to a relatively high voltage due to capacitance coupling. In this state, when voltages of the selection gate lines (sSGD, uSGD, SGS) are raised to the voltage $V_{SG}$ and the selection transistors (STD, STS) are in an ON state at timing $T_{027}$, electrons flow into the channels of the memory cells MC from the bit line BL and the source line SL at this timing. As a result, a relatively high current may flow through the selection transistors (STD, STS). In such a case, there is a possibility that the select transistors (STD, STS) have defects. For example, in a case where the drain selection transistor STD has a similar configuration to the memory cell MC such that the charge accumulation film 132 is included in its gate insulation film, hot electrons etc. may be injected to this charge accumulation film 132, and a threshold voltage of the drain selection transistor STD may vary. Alternatively, even if the drain selection transistor STD is configured to include no charge accumulation film 132 at its gate insulation film, hot electrons etc. may be injected to the charge accumulation film 132 of the memory cell MC etc. adjacent to the selection transistors (STD, STS).

Effect of First Embodiment

As explained with reference to FIG. 6, in the write operation according to the first embodiment, at timing $T_{126}$, voltages of the wiring CG and the word line WL are lowered to the voltage $V_2$. Consequently, the difference between voltages of the channels of memory cells MC and voltages of the bit line BL as well as the source line SL becomes small. In this state, by raising voltages of the selection gate lines (sSGD, uSGD, SGS) to the voltage $V_{SG}$ (timing $T_{127}$), the current flowing at this very minute is inhibited to inhibit the above defects, thereby providing the semiconductor memory device which can be preferably controlled.

Second Embodiment

Figure 9:
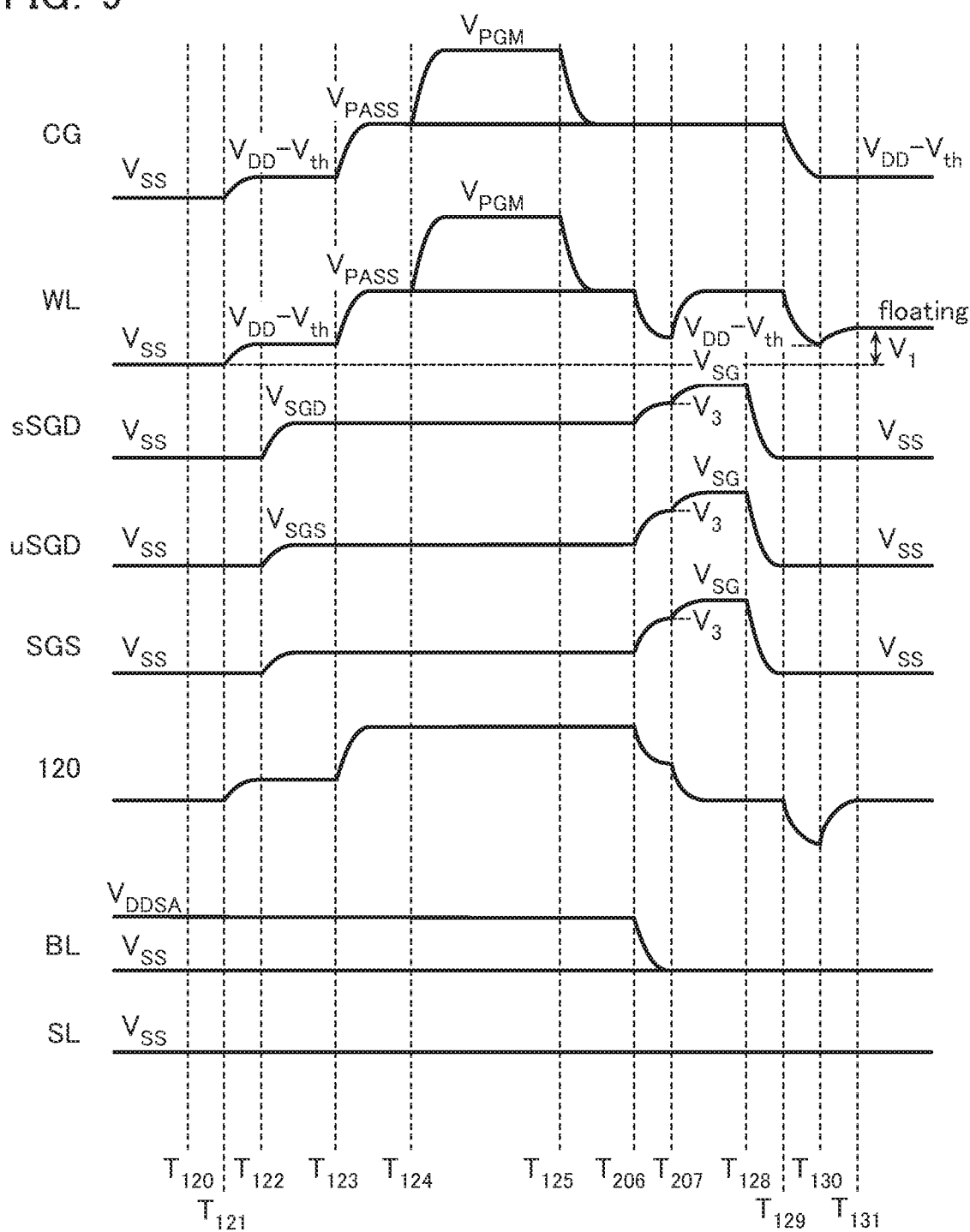
FIG. 9 shows a schematic waveform diagram showing a write operation according to a second embodiment.

Next, a write operation of the semiconductor memory device according to a second embodiment will be explained with reference to FIG. 9. Note that, in the following explanation, portions similar to in the first embodiment will be assigned with identical symbols to those assigned in the first embodiment, and descriptions thereof will be omitted.

The write operation according to the second embodiment is executed substantially in the same manner as the write operation according to the first embodiment. However, in the write operation according to the second embodiment, processing at timing $T_{126}$ of the write operation according to the first embodiment is not executed.

Also, in the write operation according to the second embodiment, after voltages of the wiring CG and the word line WL are lowered to the voltage $V_{PASS}$ at timing $T_{125}$, voltages of the selection gate lines (sSGD, uSGD, SGS) are raised to a voltage $V_3$ at timing $T_{206}$. The voltage $V_3$ is larger than the voltage $V_{SGD}$ and smaller than the voltage $V_{SG}$.

By doing this, the channels of all the memory cells MC are conducted with both the bit line BL and the source line SL. Also, electrons are supplied to all these channels from both the bit line BL and the source line SL. Note that the current flowing through the channels, the bit lines BL and the source line SL is limited by the selection transistors (STD, STS).

Next, at timing $T_{207}$, the voltages of the selection gate lines (sSGD, uSGD, SGS) are raised to the voltage $V_{SG}$.

By doing this, electrons are again supplied to the channels of the memory cells MC from both the bit line BL and the source line SL, and the voltages of these channels are lowered to approximately the voltage $V_{SS}$.

After that, process at timing $T_{128}$ and thereafter of the write operation according to the first embodiment is executed.

Here, in this embodiment, a slight current flows through the source and the drain in the selection transistors (STD, STS) by raising the voltages of the selection gate lines (sSGD, uSGD, SGS) to the voltage $V_3$ at timing $T_{206}$. However, since the voltage $V_3$ is smaller than the voltage $V_{SG}$, the current flowing at this timing is smaller than the corresponding current according to the second comparative example. Note that, at timing $T_{206}$, the voltage of the channel of the memory cell MC is lowered to a certain level of voltage.

Also, in this embodiment, by raising the voltages of the selection gate lines (sSGD, uSGD, SGS) to the voltage $V_{SG}$ at timing $T_{207}$, the selection transistors (STD, SGS) are in an ON state. At this timing, the current flows through the source and the drain in the selection transistors (STD, STS). However, since the voltage of the channel of the memory cell MC is lowered to a certain level of voltage, the current flowing at this timing is also smaller than the corresponding current according to the second comparative example.

Accordingly, also by such method, the above defects can be inhibited, thereby providing the semiconductor memory device which can be preferably controlled.

Third Embodiment

Figure 10:
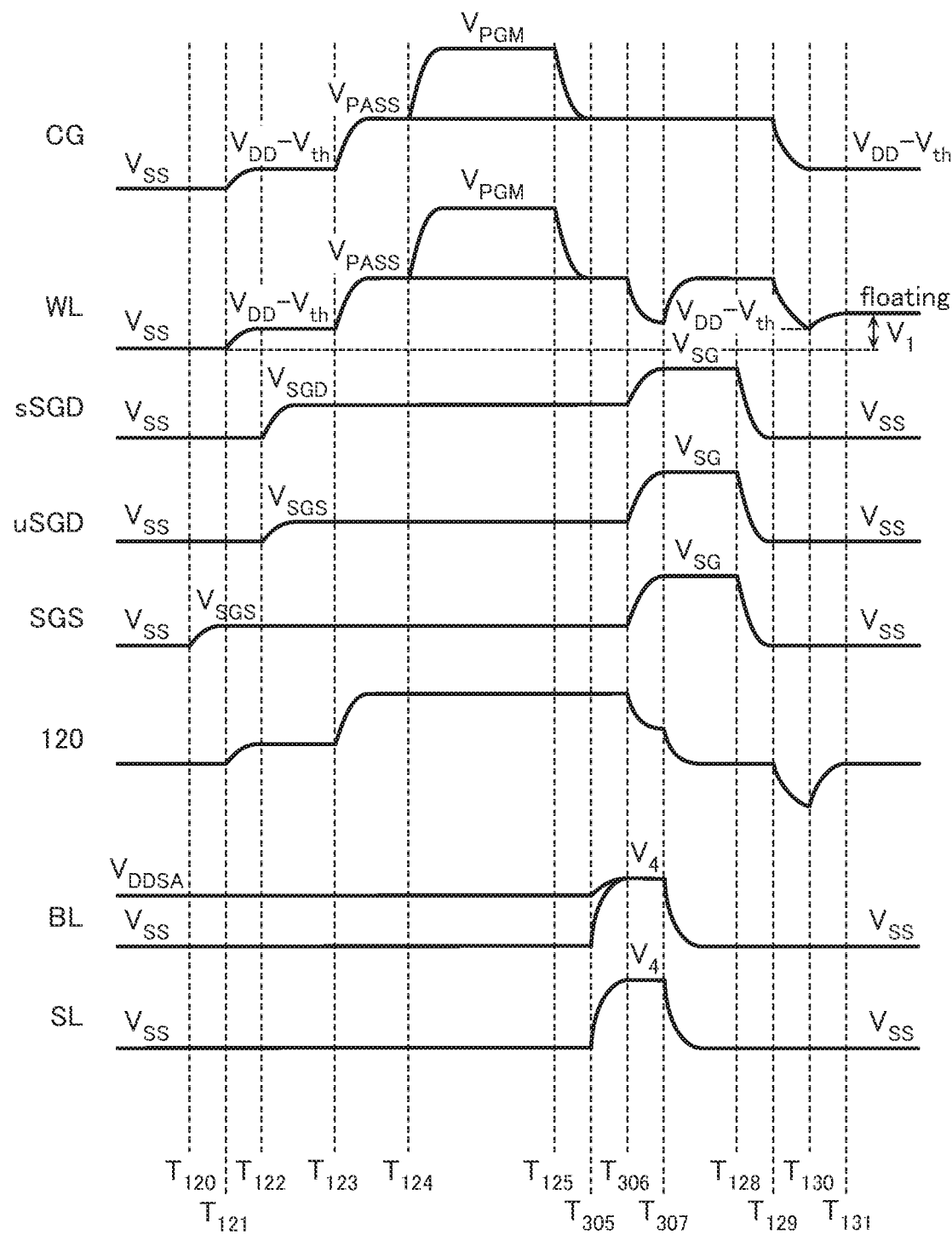
FIG. 10 shows a schematic waveform diagram showing a write operation according to a third embodiment.

Next, a write operation of the semiconductor memory device according to a third embodiment will be explained with reference to FIG. 10. Note that, in the following explanation, portions similar to in the first embodiment will be assigned with identical symbols to those assigned in the first embodiment, and descriptions thereof will be omitted.

The write operation according to the third embodiment is executed substantially in the same manner as the write operation according to the first embodiment. However, in the write operation according to the third embodiment, processing at timing $T_{126}$ of the write operation according to the first embodiment is not executed.

Also, in the write operation according to the third embodiment, at timing $T_{125}$, the voltages of the wiring CG and the word line WL are lowered to the voltage $V_{PASS}$, and then at timing $T_{305}$, the voltages of the bit line BL and the source line SL are raised to a voltage $V_4$. The voltage $V_4$ may be larger than the voltage $V_{DDSA}$ or may be approximately the same as the voltage $V_{DDSA}$.

Next, at timing $T_{306}$, the voltages of the selection gate lines (sSGD, uSGD, SGS) are raised to the voltage $V_{SG}$.

Next, at timing $T_{307}$, the voltages of the bit line BL and the source line SL are lowered to the voltage $V_{SS}$.

After that, processing at timing $T_{128}$ and thereafter of the write operation according to the first embodiment is executed.

Here, in this embodiment, at timing $T_{305}$, the voltages of the bit line BL and the source line SL are raised to the voltage $V_4$. Consequently, the difference between the voltage of the channel of the memory cell MC and the voltages of the bit line BL and the source line SL is made smaller. Accordingly, by raising the voltages of the selection gate lines (sSGD, uSGD, SGS) to the voltage $V_{SG}$ in this state (timing $T_{306}$), the current flowing at this timing is inhibited to inhibit the above defects, thereby providing the semiconductor memory device which can be preferably controlled.

Variants of the First to Third Embodiments

The writing methods according to the first, the second and the third embodiments may be used in a combination appropriately. For example, after processing at timing $T_{126}$ is executed in the first embodiment, prior to executing processing at timing $T_{127}$, the voltages of the selection gate lines (sSGD, uSGD, SGS) may be raised to the voltage $V_3$ in the same manner as the second embodiment. Also, in the first embodiment for example, at timing $T_{126}$ or before or after that, the voltage of the bit line BL may be raised to the voltage $V_4$ in the same manner as the third embodiment. Moreover, after processing of timing $T_{125}$ is executed in the second embodiment, prior to executing processing at timing $T_{206}$, the voltage of the bit line BL may be raised at the voltage $V_4$ in the same manner as the third embodiment. Also, in the first embodiment, at timing $T_{123}$ the voltages of the wiring CG and the word line WL are raised to the voltage $V_{PASS}$, and further, the voltages of the selection gate lines (sSGD, uSGD, SGS) are raised to the voltage $V_{SG}$. However, the voltages of the wiring CG and the word line WL may be raised to the voltage $V_{PASS}$ between the timing $T_{123}$ and timing $T_{128}$.

Also, in the second embodiment, the voltages of the selection gate lines (sSGD, uSGD, SGS) are raised to the voltage $V_{SG}$ in two stages. However, the voltages of the selection gate lines (sSGD, uSGD, SGS) may be raised to the voltage $V_{SG}$ in three or more stages.

Fourth Embodiment

Next, a fourth embodiment will be explained with reference to FIG. 11. Note that, in the following explanation, portions similar to in the first embodiment will be assigned with identical symbols to those assigned in the first embodiment, and descriptions thereof will be omitted.

A write operation according to the fourth embodiment is the same as the write operation according to the first comparative example. Also, a read operation according to the fourth embodiment is the same as the first embodiment.

Also, in the fourth embodiment, a dummy read operation is executed for each elapse of a certain amount of time and for each satisfaction of a certain condition. The dummy read operation is executed substantially in the same manner as the read operation according to the first embodiment.

Figure 11:
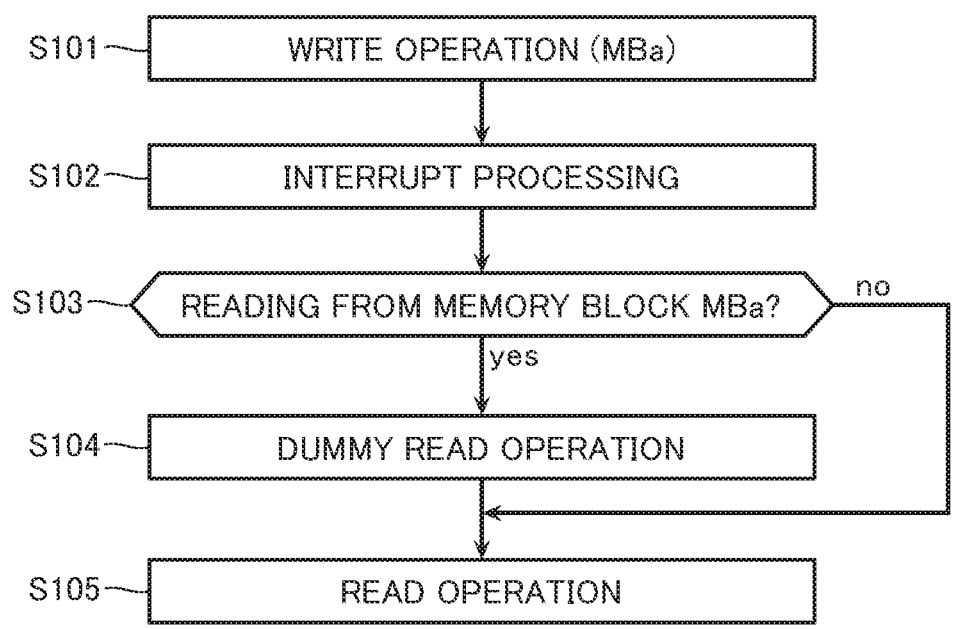
FIG. 11 shows a schematic flow chart for explaining about processing according to a fourth embodiment.

For example, as schematically illustrated in FIG. 11, when a read command etc. is received during execution of a write operation (S101), the sequencer 26 (FIG. 1) once stops the write operation, and executes a read operation as an interrupt processing (S102). Also, the sequencer 26 holds the address of the memory block MBa for which the write operation is executed and the progress status of the write operation etc. in a register etc.

Next, the sequencer 26 refers to an address data which is an object of the read operation and judges whether this address corresponds to the memory block MBa (S103).

If the address does not correspond to the memory block MBa, the sequencer 26 executes the read operation as usual (S105).

On the other hand, if the address corresponds to the memory block MBa, the sequencer 26 executes a dummy read operation to the memory block MBa (S104), and then executes a usual read operation (S105).

Also, by such method, erroneous reading can be inhibited by adjusting the voltage of the word line WL when the read operation is executed. Moreover, such method prevents variation etc. of the threshold voltage of the drain selection transistor STD.

Also, considering a possibility that a memory block MBa for which the write operation is executed corresponds to a memory block for which the interrupt processing is executed, such a possibility is sometimes not high. In such a case, the time required for the write operation can be sometimes reduced by combining the read operation according to the first comparable example and the dummy read operation.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a bit line extending in a first direction;
a source line;
a memory cell array including: (i) a memory string including a plurality of memory cell transistors connected in series, the memory cell transistors including a first memory cell transistor and a second memory cell transistor, (ii) a first selection transistor connected between the bit line and the memory string, and (iii) a second selection transistor connected between the memory string and the source line;
a plurality of word lines each extending in a second direction crossing the first direction, and being arranged in a third direction crossing the first direction and the second direction, the word lines being connected to gate electrodes of the memory cell transistors, respectively, and the word lines including a first word line connected to the gate electrode of the first memory cell transistor, and a second word line connected to the gate electrode of the second memory cell transistor;
a first selection line connected to a gate electrode of the first selection transistor; and
a second selection line connected to a gate electrode of the second selection transistor,
wherein:
in a read operation performed to the first memory cell transistor,
a first voltage is applied to the first word line,
a second voltage higher than the first voltage is applied to the second word line,
a third voltage higher than the first voltage is applied to the first selection line,
a fourth voltage higher than the first voltage is applied to the second selection line, and
after data is read, voltages applied to the first selection line and the second selection line are decreased, and thereafter voltages applied to the first word line and the second word line are decreased, and
in a write operation performed to the first memory cell transistor,
a fifth voltage is applied to the first word line,
a sixth voltage lower than the fifth voltage is applied to the second word line,
a seventh voltage lower than the fifth voltage is applied to the first selection line,
an eighth voltage lower than the seventh voltage is applied to the second selection line, and
when a command to stop is received during the write operation, voltages applied to the first selection line and the second selection line are decreased, and thereafter voltages applied to the first word line and the second word line are decreased.

2. The semiconductor memory device according to claim 1, wherein:
when the command to stop is received during the write operation,
a ninth voltage lower than the sixth voltage is applied to the first word line and to the second word line,
thereafter a tenth voltage higher than the seventh voltage is applied to the first selection line,
thereon or thereafter an eleventh voltage higher than the tenth voltage is applied to the first word line and to the second word line,
thereafter a twelfth voltage lower than the tenth voltage is applied to the first selection line, and thereafter a thirteenth voltage is applied to the first word line and the second word line.

3. The semiconductor memory device according to claim 2, wherein in the write operation:
after the thirteenth voltage is applied to the first word line and to the second word line, the first word line and the second word line are brought into a floating state.

4. The semiconductor memory device according to claim 3, wherein in the write operation:
after the first word line and the second word line are brought into the floating state, voltages of the first word line and the second word line rise.

5. The semiconductor memory device according to claim 2, wherein in the write operation:
before the ninth voltage is applied to the first word line and to the second word line, the sixth voltage is applied to the first word line and to the second word line,
thereafter, the fifth voltage is applied to the first word line while the second sixth voltage is applied to the second word line, and
thereafter the sixth voltage is applied to the first word line and to the second word line.

6. The semiconductor memory device according to claim 2, wherein:
in the write operation, an amount of decrease of the voltage of the first word line falling to the ninth voltage and an amount of increase of the voltage of the first word line rising to the eleventh voltage are smaller than an amount of increase of the voltage of the first word line rising to the fifth voltage and an amount of decrease of the voltage of the first word line falling to the thirteenth voltage.

7. The semiconductor memory device according to claim 1, further comprising:
a first to fourth voltage supply lines;
a voltage driver configured to supply voltages to the first to fourth voltage supply lines;
a first transistor connected between the first voltage supply line and the first word line;
a second transistor connected between the second voltage supply line and the second word line;
a third transistor connected between the third voltage supply line and the first selection line; and
a fourth transistor connected between the fourth voltage supply line and the second selection line.

8. The semiconductor memory device according to claim 7, wherein in the write operation:
after the first word line and the second word line are brought into the floating state, voltage of the first word line and the second word line rise while the first and second voltage supply lines are disconnected from the first and second word lines and the third and fourth voltage supply lines are disconnected from the first and second selection lines.

9. The semiconductor memory device according to claim 7, further comprising:
a block decoder configured to apply a fourteenth voltage higher than the fifth voltage at least during the write operation.

10. The semiconductor memory device according to claim 1, wherein:
the read operation is started in response to a read command, and
the write operation is started in response to a write command.

11. The semiconductor memory device according to claim 1, wherein:
the command to stop the write operation includes a read command.

12. The semiconductor memory device according to claim 2, wherein in the write operation performed to the first memory cell transistor:
while the fifth voltage is applied to the first word line and the sixth voltage is applied to the second word line, the seventh voltage is applied to the first selection line to turn on the first selection transistor, and the eighth voltage is applied to the second selection line to turn off the second selection transistor.

13. The semiconductor memory device according to claim 12, wherein:
when the command to stop is received during the write operation,
after the ninth voltage is applied to the first word line and to the second word line, the eighth voltage is applied to the second selection line, and
upon or after the eleventh voltage being applied to the first word line and to the second word line, a twelfth voltage is applied to the second selection line.

14. The semiconductor memory device according to claim 7, further comprising:
a semiconductor substrate on which the voltage driver is formed.

15. The semiconductor memory device according to claim 14, wherein:
the memory cell array is provided at one side of the semiconductor substrate in the third direction.

16. A method for controlling semiconductor memory device comprising:
a bit line extending in a first direction;
a source line;
a memory cell array including:
a memory string including a plurality of memory cell transistors connected in series, the memory cell transistors including a first memory cell transistor and a second memory cell transistor,
a first selection transistor connected between the bit line and the memory string, and
a second selection transistor connected between the memory string and the source line;
a plurality of word lines each extending in a second direction crossing the first direction, and being arranged in a third direction crossing the first direction and the second direction, the word lines being connected to gate electrodes of the memory cell transistors, respectively, and the word lines including:
a first word line connected to the gate electrode of the first memory cell transistor, and
a second word line connected to the gate electrode of the second memory cell transistor;
a first selection line connected to a gate electrode of the first selection transistor; and
a second selection line connected to a gate electrode of the second selection transistor,
the method comprising:
performing a read operation to the first memory cell transistor by:
applying a first voltage to the first word line,
applying a second voltage higher than the first voltage to the second word line,
applying a third voltage higher than the first voltage to the first selection line, and
applying a fourth voltage higher than the first voltage to the second selection line,
after data has been read, decreasing voltages applied to the first selection line and the second selection line, and thereafter decreasing voltages applied to the first word line and the second word line;
performing a write operation to the first memory cell transistor by:
applying a fifth voltage to the first word line,
applying a sixth voltage lower than the fifth voltage to the second word line,
applying a seventh voltage lower than the fifth voltage to the first selection line, and
applying an eighth voltage lower than the seventh voltage to the second selection line; and
when a command to stop is received during the write operation, decreasing voltages applied to the first selection line and the second selection line, and thereafter decreasing voltages applied to the first word line and the second word line.

17. The method according to claim 16, wherein:
when the command to stop is received during the write operation,
a ninth voltage lower than the sixth voltage is applied to the first word line and to the second word line,
thereafter a tenth voltage higher than the seventh voltage is applied to the first selection line,
thereon or thereafter an eleventh voltage higher than the tenth voltage is applied to the first word line and to the second word line,
thereafter a twelfth voltage lower than the tenth voltage is applied to the first selection line, and thereafter a thirteenth voltage is applied to the first word line and to the second word line.

18. The method according to claim 17, wherein in the write operation:
after the thirteenth voltage is applied to the first word line and to the second word line, the first word line and the second word line are brought into a floating state.

19. The method according to claim 18, wherein in the write operation:
after the first word line and the second word line are brought into the floating state, voltages of the first word line and the second word line rise.

20. The method according to claim 19, wherein in the write operation:
before the ninth voltage is applied to the first word line and to the second word line, the sixth voltage is applied to the first word line and to the second word line,
thereafter, the fifth voltage is applied to the first word line while the second sixth voltage is applied to the second word line, and
thereafter the sixth voltage is applied to the first word line and to the second word line.

21. The method according to claim 19, wherein:
in the write operation, an amount of decrease of the voltage of the first word line falling to the ninth voltage and an amount of increase of the voltage of the first word line rising to the eleventh voltage are smaller than an amount of increase of the voltage of the first word line rising to the fifth voltage and an amount of decrease of the voltage of the first word line falling to the thirteenth voltage.

* * * * *